(12) United States Patent
Tseng et al.

(10) Patent No.: US 8,288,662 B2
(45) Date of Patent: Oct. 16, 2012

(54) CIRCUIT STRUCTURE

(75) Inventors: Tzyy-Jang Tseng, Hsinchu (TW);
Chang-Ming Lee, Taoyuan County
(TW); Wen-Fang Liu, Taoyuan County
(TW); Cheng-Po Yu, Taoyuan County
(TW)

(73) Assignee: Unimicron Technology Corp., Taoyuan
(TW)

( * ) Notice: Subject to any disclaimer, the term of this
patent is extended or adjusted under 35
U.S.C. 154(b) by 225 days.

(21) Appl. No.: 12/718,194

(22) Filed: Mar. 5, 2010

(65) Prior Publication Data

US 2011/0094779 A1   Apr. 28, 2011

(30) Foreign Application Priority Data

Oct. 26, 2009 (TW) .............................. 98136193 A

(51) Int. Cl.
*H05K 1/11* (2006.01)

(52) U.S. Cl. ......... 174/261; 174/262; 174/264; 174/256

(58) Field of Classification Search .................. 174/256,
174/261, 262, 264, 265
See application file for complete search history.

(56) References Cited

U.S. PATENT DOCUMENTS

| 4,417,393 A | * | 11/1983 | Becker ............................ 29/846 |
| 4,604,799 A | * | 8/1986 | Gurol .............................. 29/847 |
| 4,985,601 A | * | 1/1991 | Hagner .......................... 174/261 |
| 4,996,391 A | * | 2/1991 | Schmidt ......................... 174/255 |
| 5,302,547 A | | 4/1994 | Wojnarowski et al. ....... 437/173 |
| 5,494,782 A | | 2/1996 | Maenza et al. ................. 430/321 |
| 5,666,722 A | | 9/1997 | Tamm et al. ..................... 29/847 |
| 6,000,130 A | | 12/1999 | Chang et al. ..................... 29/852 |
| 6,035,527 A | | 3/2000 | Tamm ............................. 29/852 |
| 6,541,712 B1 | * | 4/2003 | Gately et al. .................. 174/266 |
| 6,951,120 B2 | | 10/2005 | McCaughan et al. ........... 65/392 |
| 7,028,400 B1 | | 4/2006 | Hiner et al. ..................... 29/852 |
| 7,080,448 B2 | | 7/2006 | Wu et al. ......................... 29/852 |
| 7,199,911 B2 | | 4/2007 | Hudson et al. .................... 359/2 |
| 2001/0042733 A1 | | 11/2001 | Appelt et al. .................... 216/13 |

(Continued)

FOREIGN PATENT DOCUMENTS

CN            1772948            5/2006

(Continued)

OTHER PUBLICATIONS

"First Office Action of China counterpart application" issued on May 14, 2012, p. 1-p. 4, in which the listed references were cited.

*Primary Examiner* — Hoa C Nguyen
(74) *Attorney, Agent, or Firm* — J.C. Patents

(57) ABSTRACT

A circuit structure including a circuit board, an insulating layer, a conductive via, a platable dielectric layer and a conductive pattern is provided. The insulating layer is disposed on the circuit board and covers a circuit layer of the circuit board. The conductive via passes through the insulating layer and connects the circuit layer and protrudes from a surface of the insulating layer. The platable dielectric layer having a trench pattern is disposed on the surface of the insulating layer wherein the portion of the conductive via protruding from the surface is located in the trench pattern. The material of the platable dielectric layer includes a chemical platable material. The conductive pattern is in the trench pattern and connects the conductive via wherein an interface exists between the conductive pattern and the conductive via and protrudes from the surface of the insulating layer.

12 Claims, 1 Drawing Sheet

U.S. PATENT DOCUMENTS

| | | | |
|---|---|---|---|
| 2002/0092677 A1* | 7/2002 | Farquhar et al. | 174/262 |
| 2004/0252730 A1 | 12/2004 | McCaughan et al. | 372/6 |
| 2005/0029010 A1* | 2/2005 | Ahn et al. | 174/255 |
| 2005/0112472 A1 | 5/2005 | Kutsch et al. | 430/1 |
| 2005/0231105 A1 | 10/2005 | Lovell et al. | 313/506 |
| 2005/0236181 A1* | 10/2005 | Chen et al. | 174/256 |
| 2006/0145146 A1 | 7/2006 | Suh et al. | 257/40 |
| 2006/0191715 A1* | 8/2006 | Koyama et al. | 174/264 |
| 2007/0037065 A1 | 2/2007 | Kutsch et al. | 430/1 |
| 2007/0132536 A1* | 6/2007 | Lee et al. | 336/200 |
| 2008/0052904 A1 | 3/2008 | Schneider et al. | |
| 2008/0264684 A1* | 10/2008 | Kang et al. | 174/262 |
| 2008/0283288 A1* | 11/2008 | Mok et al. | 174/264 |
| 2009/0044970 A1* | 2/2009 | Kosowsky | 174/256 |
| 2009/0152121 A1* | 6/2009 | Moon et al. | 205/183 |
| 2010/0006334 A1* | 1/2010 | Takenaka et al. | 174/262 |
| 2011/0005824 A1* | 1/2011 | An et al. | 174/261 |
| 2011/0024176 A1* | 2/2011 | Ko | 174/261 |

FOREIGN PATENT DOCUMENTS

| | | |
|---|---|---|
| CN | 101409982 | 4/2009 |
| TW | I288591 | 10/2007 |
| TW | 200805611 | 1/2008 |
| TW | I299646 | 8/2008 |

* cited by examiner

CIRCUIT STRUCTURE

CROSS-REFERENCE TO RELATED APPLICATION

This application claims the priority benefit of Taiwan application serial no. 98136193, filed on Oct. 26, 2009. The entirety of the above-mentioned patent application is hereby incorporated by reference herein and made a part of this specification.

BACKGROUND OF THE INVENTION

1. Field of the Invention

The present invention relates to a circuit structure, and more particularly, to a circuit structure having a fine circuit.

2. Description of Related Art

Currently, with the rapid advancement of the fabrication techniques of the electronic industry, the circuit boards capable of carrying various electronic components are widely applied in the electronic products with various functionalities. Recently, the electronic products are developed with a trend toward multi-functional and small. Under this trend, it is necessary to increase the layout density of the circuit board to carry a lot of high-precision electronic components. Furthermore, the increasing of the layout density of the circuit board can be achieved by decreasing the line width and the line pitch.

In the conventional techniques, the method for forming the circuit layer comprises entirely electroplating a metal layer on the substrate and then patterning the metal layer by using the photolithography. However, the conventional techniques are limited by the uniformity of the metal layer formed by the electroplating process and the precision of the photolithography process. Hence, it is hard to fabricate the circuit with the line width smaller than 40 micrometers. Thus, the product yield is poor and the cost is high.

SUMMARY OF THE INVENTION

The invention provides a circuit structure having a relatively small line width.

The invention provides a circuit structure comprises a circuit board, an insulating layer, a conductive via, a platable dielectric layer and a conductive pattern. The conductive via penetrates through the insulating layer and is connected to the circuit layer, wherein the conductive via protrudes from a first surface of the insulating layer. The platable dielectric layer is configured on the first surface of the insulating layer and has a trench pattern, wherein a protrudent portion of the conductive via protruding from the first surface of the insulating layer is located in the trench pattern and a material of the platable dielectric layer includes a chemical platable material. The conductive pattern is located in the trench pattern and is connected to the conductive via, wherein there is an interface located between the conductive pattern and the conductive via.

According to one embodiment of the present invention, the platable dielectric layer has a second surface away from the circuit board, wherein the second surface has the trench pattern, the circuit structure further comprises an non-platable dielectric layer configured on the second surface and located outside the trench pattern and a material of the non-platable dielectric layer comprises a chemical non-platable material.

According one embodiment of the present invention, a material of the non-platable dielectric layer comprises a polymer material without having any hydroxyl group (OH group) or carboxyl group (COOH group).

According to one embodiment of the present invention, the polymer material comprises epoxy resin, polyimide, liquid crystal polymer, methacrylate resin, vinyl phenyl resin, allyl resin, polyacrylate resin, polyether resin, polyolefin resin, polyamine resin, polysiloxane resin or the combination thereof.

According to one embodiment of the present invention, a material of the non-platable dielectric layer comprises a laser-processable material.

According to one embodiment of the present invention, a material of the platable dielectric layer comprises a polymer material.

According to one embodiment of the present invention, the polymer material comprises epoxy resin, polyimide, liquid crystal polymer or the combination thereof.

According to one embodiment of the present invention, a material of the platable dielectric layer comprises a laser-processable material.

According to one embodiment of the present invention, a material of the insulating layer comprises resin, polyimide or liquid crystal polymer.

According to one embodiment of the present invention, a material of the insulating layer comprises glass fiber.

According to one embodiment of the present invention, the conductive pattern covers the conductive via.

According to one embodiment of the present invention, the minimum line width of the conductive pattern is smaller than 40 micrometers.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
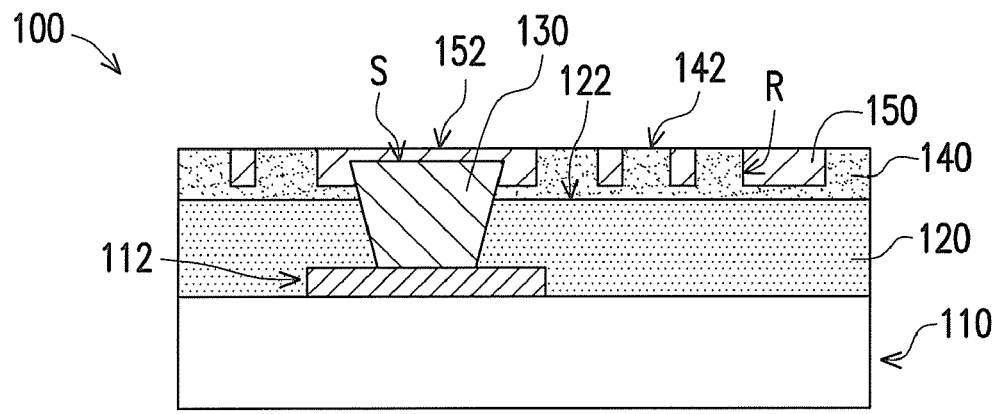
FIG. 1 is a schematic cross-sectional view showing a circuit structure according to one embodiment of the present invention.
Figure 2:
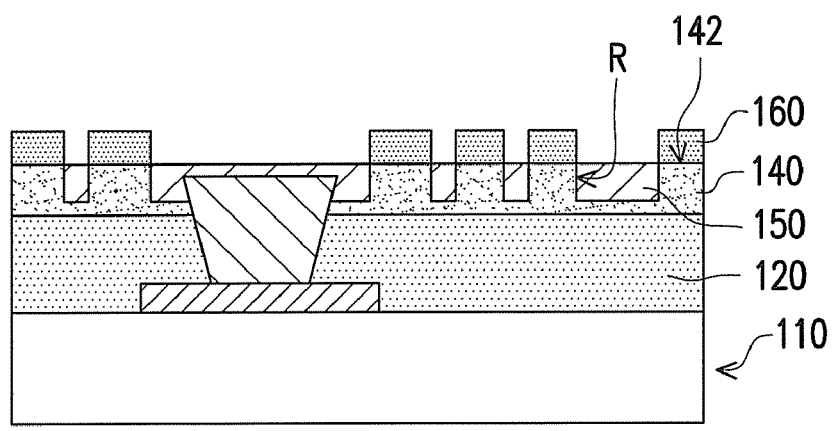
FIG. 2 is a schematic diagram showing a variation of the circuit structure of FIG. 1.

FIG. 1 is a schematic cross-sectional view showing a circuit structure according to one embodiment of the present invention. FIG. 2 is a schematic diagram showing a variation of the circuit structure of FIG. 1.

As shown in FIG. 1, a circuit structure 100 of the present embodiment comprises a circuit board 110, an insulating layer 120, a conductive via 130, a platable dielectric layer 140 and a conductive pattern 150.

The insulating layer 120 is configured on the circuit board 110 and covering a circuit layer 112 of the circuit board 110. In the present embodiment, the material of the insulating layer 120 comprises resin, polyimide, liquid crystal polymer or Aramid. In the present embodiment, the insulating layer 120 can be, for example, a prepreg and the material of the insulating layer 120 comprises glass fiber. The conductive via 130 penetrates through the insulating layer 120 and is connected to the circuit layer 112. The conductive via 130 protrudes from a surface 122 of the insulating layer 120, wherein the surface 122 faces toward a direction away from the circuit board 110.

The platable dielectric layer 140 is configured on the surface 122 of the insulating layer 120 and has a trench pattern R. The trench pattern R does not penetrate through the platable dielectric layer 140. The protrudent portion of the conductive via 130 protruding from the surface 122 is located in the trench pattern R. The material of the platable dielectric layer 140 comprises a chemical platable material. More specifically, in the present embodiment, the chemical platable material denotes the material capable of adsorbing catalyst during the chemical plating process. The material of the platable dielectric layer 140 can be, for example, polymer material. The polymer material comprises epoxy resin, polyimide, liquid crystal polymer or the combination thereof. In the present embodiment, the material of the platable dielectric layer 140 can be a laser-processable material which can be easily removed during the laser ablating.

More specifically, the platable dielectric layer 140 has a surface 142 face away from the circuit board 110 and the surface 142 has a trench pattern R. In the present embodiment, an non-platable dielectric layer 160 can be configured on the surface 142 located outside the trench pattern R (as shown in FIG. 2). The material of the non-platable dielectric layer 160 comprises a chemical non-platable material. More specifically, in the present embodiment, the chemical non-platable material denotes the material incapable of adsorbing catalyst during the chemical plating process. The material of the non-platable dielectric layer 160 can be, for example, a polymer material without having any hydroxyl group (OH group) or carboxyl group (COOH group). That is, the polymer material is a hydrophobic polymer material. Further, the polymer material comprises epoxy resin, polyimide, liquid crystal polymer, methacrylate resin, vinyl phenyl resin, allyl resin, polyacrylate resin, polyether resin, polyolefin resin, polyamine resin, polysiloxane resin or the combination thereof. In the present embodiment, the material of the non-platable dielectric layer 160 comprises a laser-processable material.

As shown in FIG. 1, the conductive pattern 150 is located in the trench pattern R and is connected to the conductive via 130. There is an interface S between the conductive pattern 150 and the conductive via 130 and the interface S can be, for example, an uneven surface. The interface S protrudes from the surface 122 of the insulating layer 120. In the present embodiment, the conductive pattern 150 covers the conductive via 130. In other words, the conductive via 130 protrudes from the surface 122 of the insulating layer 120 joints the conductive pattern 150 by the method similar to the tenon joint. In other embodiments, a terminal (not shown) of the conductive via 130 faces away from the circuit board 110 can be aligned with the surface 152 of the conductive pattern 150.

It should be noticed that, as shown in FIG. 2, the fabrication method of the conductive pattern 150 comprises forming the insulating layer 120, the platable dielectric layer 140 and the non-platable dielectric layer 160 on the circuit board 110, and then performing a chemical plating process to form the conductive pattern 150 in the trench pattern R. Since the conductive pattern 150 is only formed on the platable dielectric layer 140 exposed by the trench pattern R, the conductive pattern 150 only fills the trench pattern R. Hence, the conductive pattern 150 can be defined by using the trench pattern R. Further, the minimum line width of the conductive pattern 150 formed in the trench pattern R can be adjusted by controlling the minimum trench width of the trench pattern R. Moreover, since both of the platable dielectric layer 140 and the non-platable dielectric layer 160 are made of the laser-processable materials, the trench pattern R can be formed by using the laser ablating. Thus, the circuit layer can be formed without performing the photolithography process. Therefore, the minimum line width of the conductive pattern 150 can be decreased (e.g. the minimum line width of the conductive pattern 150 is smaller than 40 micrometers), the process yield is improved and the cost is decreased.

In the conventional subtractive process for manufacturing the circuit, the line width of the circuit is limited by the process ability such as the precision of the photolithography process and is not easy to be decreased to be smaller than 40 micrometers so that the product yield is poor and the cost is high. By comparing with the conventional subtractive process, the present embodiment provides the method comprising forming the trench pattern R and then forming the circuit (i.e. the conductive pattern 150) in the trench pattern R so that the minimum trench width of the trench pattern R is as same as the minimum line width of the conductive pattern 150. Since both of the platable dielectric layer 140 and the non-platable dielectric layer 160 can be made of the laser-processable material, the laser ablating can be used in the present embodiment to form trench pattern R. Hence, the minimum trench width can be smaller than 40 micrometers. Thus, the minimum line width of the conductive pattern 150 can be smaller than 40 micrometers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit structure, comprising:
    a circuit board;
    an insulating layer configured on the circuit board and covering a circuit layer of the circuit board;
    a conductive via penetrating through the insulating layer and connected to the circuit layer, wherein the conductive via protrudes from a first surface of the insulating layer;
    a platable dielectric layer configured on the first surface of the insulating layer and having a trench pattern, wherein a protrudent portion of the conductive via protruding from the first surface of the insulating layer is located in the trench pattern and a material of the platable dielectric layer includes a chemical platable material; and
    a conductive pattern located in the trench pattern and connected to the conductive via, wherein there is a wedged mortise-and-tenon interface located between the conductive pattern and the protrudent portion of the conductive via.

2. The circuit structure of claim 1, wherein the platable dielectric layer has a second surface away from the circuit board and the second surface has the trench pattern and the circuit structure further comprises:
    a non-platable dielectric layer configured on the second surface and located outside the trench pattern, wherein a material of the non-platable dielectric layer includes a chemical non-platable material.

3. The circuit structure of claim 2, wherein a material of the non-platable dielectric layer includes a polymer material without having hydroxyl group and carboxyl group.

4. The circuit structure of claim 3, wherein the polymer material comprises epoxy resin, polyimide, liquid crystal polymer, methacrylate resin, vinyl phenyl resin, allyl resin, polyacrylate resin, polyether resin, polyolefin resin, polyamine resin, polysiloxane resin or the combination thereof.

5. The circuit structure of claim 2, wherein a material of the non-platable dielectric layer comprises a laser-processable material.

6. The circuit structure of claim 1, wherein a material of the platable dielectric layer comprises a polymer material.

7. The circuit structure of claim 6, wherein the polymer material comprises epoxy resin, polyimide, liquid crystal polymer or the combination thereof.

8. The circuit structure of claim 1, wherein a material of the platable dielectric layer comprises a laser-processable material.

9. The circuit structure of claim 1, wherein a material of the insulating layer comprises resin, polyimide or liquid crystal polymer.

10. The circuit structure of claim 1, wherein a material of the insulating layer comprises glass fiber.

11. The circuit structure of claim 1, wherein the conductive pattern covers the conductive via.

12. The circuit structure of claim 1, wherein the minimum line width of the conductive pattern is smaller then 40 micrometers.

* * * * *